United States Patent
Ando et al.

(10) Patent No.: US 10,559,748 B2
(45) Date of Patent: Feb. 11, 2020

(54) TUNNEL MAGNETIC RESISTANCE ELEMENT AND METHOD FOR MANUFACTURING SAME

(71) Applicants: TOHOKU UNIVERSITY, Sendai-shi, Miyagi (JP); Konica Minolta, Inc., Tokyo (JP)

(72) Inventors: Yasuo Ando, Sendai (JP); Mikihiko Oogane, Sendai (JP); Kosuke Fujiwara, Sendai (JP); Junichi Jono, Tokyo (JP)

(73) Assignees: TOHOKU UNIVERSITY, Miyagi (JP); KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 16/077,601

(22) PCT Filed: Feb. 16, 2017

(86) PCT No.: PCT/JP2017/005608
§ 371 (c)(1),
(2) Date: Aug. 13, 2018

(87) PCT Pub. No.: WO2017/141999
PCT Pub. Date: Aug. 24, 2017

(65) Prior Publication Data
US 2019/0044058 A1    Feb. 7, 2019

(30) Foreign Application Priority Data
Feb. 19, 2016  (JP) ................................ 2016-029566

(51) Int. Cl.
*H01L 43/10* (2006.01)
*H01L 43/08* (2006.01)
(Continued)

(52) U.S. Cl.
CPC .............. *H01L 43/10* (2013.01); *G01R 33/09* (2013.01); *G01R 33/098* (2013.01);
(Continued)

(58) Field of Classification Search
CPC ......... H01L 43/10; H01L 43/02; H01L 43/08; H01L 43/12; G01R 33/09; G01R 33/098;
(Continued)

(56) References Cited

U.S. PATENT DOCUMENTS

| 2003/0184919 | A1* | 10/2003 | Lin ........................ | B82Y 10/00 360/314 |
| 2004/0032318 | A1* | 2/2004 | Mori ........................ | H01L 43/08 338/32 R |
| 2016/0155932 | A1* | 6/2016 | Chen ........................ | H01L 43/08 257/427 |

FOREIGN PATENT DOCUMENTS

| JP | 2013105825 A | 5/2013 |
| WO | 2015008718 A1 | 1/2015 |

OTHER PUBLICATIONS

Written Opinion of the International Searching Authority dated May 9, 2017 from corresponding International Application No. PCT/JP2017/005608 and English translationnglish translation.
(Continued)

*Primary Examiner* — Fernando L Toledo
*Assistant Examiner* — Neil R Prasad
(74) *Attorney, Agent, or Firm* — Lucas & Mercanti, LLP

(57) ABSTRACT

A tunnel magnetic resistance element includes the following, a fixed magnetic layer with a fixed direction of magnetization, a free magnetic layer in which the direction of magnetization changes, and an insulating layer which is positioned between the fixed magnetic layer and the free magnetic layer. The fixed magnetic layer, the free magnetic layer, and the insulating layer form a magnetic tunnel junction. A resistance of the insulating layer changes by a
(Continued)

tunnel effect according to a difference in an angle between the direction of magnetization of the fixed magnetic layer and the direction of magnetization of the free magnetic layer. The free magnetic layer includes a ferromagnetic layer, a soft magnetic layer, and a magnetic bonding layer placed in between. Material of the magnetic bonding layer include Ru or Ta, and a layer thickness is 1.0 nm to 1.3 nm.

5 Claims, 3 Drawing Sheets

(51) Int. Cl.
  *H01L 43/12*   (2006.01)
  *H01F 41/30*   (2006.01)
  *G01R 33/09*   (2006.01)
  *H01F 10/32*   (2006.01)
  *H01F 10/13*   (2006.01)
  *H01L 43/02*   (2006.01)

(52) U.S. Cl.
  CPC ......... *H01F 10/131* (2013.01); *H01F 10/132* (2013.01); *H01F 10/135* (2013.01); *H01F 10/3272* (2013.01); *H01F 41/307* (2013.01); *H01L 43/02* (2013.01); *H01L 43/08* (2013.01); *H01L 43/12* (2013.01)

(58) Field of Classification Search
  CPC .... H01F 10/131; H01F 10/132; H01F 10/135; H01F 10/14; H01F 10/30; H01F 41/18
  See application file for complete search history.

(56) References Cited

OTHER PUBLICATIONS

International Search Report dated May 9, 2017 for PCT/JP2017/005608 and English translation.

* cited by examiner

TUNNEL MAGNETIC RESISTANCE ELEMENT AND METHOD FOR MANUFACTURING SAME

CROSS REFERENCE TO RELATED APPLICATION

This Application is a 371 of PCT/JP2017/005608 filed on Feb. 16, 2017 which, in turn, claimed the priority of Japanese Patent Application No. 2016-029566 filed on Feb. 19, 2016, both applications are incorporated herein by reference.

TECHNOLOGICAL FIELD

The present invention relates to a tunnel magnetic resistance element and method for manufacturing same.

BACKGROUND ART

A tunnel magnetic resistance element (TMR) includes a fixed magnetic layer in which a direction of magnetization is fixed, a free magnetic layer in which a direction of magnetization changes by receiving influence of a magnetic field from outside, and an insulating layer positioned between the fixed magnetic layer and the free magnetic layer, and this forms a magnetic tunnel junction (MTJ). The resistance of the insulating layer is changed by the tunnel effect according to a difference in the angle between the direction of the magnetization of the fixed magnetic layer and the direction of magnetization of the free magnetic layer.

In the free magnetic layer, a soft magnetic layer (NiFe, CoFeSiB, etc.) which easily reacts to the magnetic field from outside is positioned and a magnetic bonding layer is placed between a ferromagnetic layer joined to the insulating layer and the soft magnetic layer. With this, the bonding of the solid state properties between the magnetic tunnel junction and the soft magnetic material can be eliminated while using the synthetic bonding which generates only the magnetic bonding. With this, the resistance of the insulating layer can be changed linked to the change of the magnetic properties of the soft magnetic material which easily reacts to the magnetic field from outside, and high sensitivity can be obtained.

For example, the free magnetic layer in patent document 1 includes a ferromagnetic layer including CoFeB joined to an insulating layer, a soft magnetic layer including NiFe and a magnetic bonding layer including Ru in between the above.

Conventionally, the thinner the thickness of the magnetic bonding layer is, the synthetic bonding between the magnetic tunnel junction and the soft magnetic material becomes stronger and more stable, and the magnetic movement becomes stable. Therefore, the magnetic bonding layer is set to be very thin at about 0.5 nm (0.85 nm in the embodiment of cited document 1).

PRIOR ART DOCUMENT

Patent Document

Patent Document 1: Japanese Patent Application Laid-Open Publication No. 2013-105825

SUMMARY

Problems to be Solved by the Invention

However, when the magnetic bonding layer becomes thin, there is the problem of heat resistance. That is, a portion of the magnetic bonding layer denatures under high temperature. With this, the synthetic bonding becomes unstable and it is not possible to sufficiently achieve the magnetic resistance properties of the tunnel magnetic resistance element.

The above becomes a large problem in magnetic heat treatment to form the tunnel magnetic resistance element and when a module including the tunnel magnetic resistance element is mounted on a substrate by reflow.

The present invention is conceived in view of the above problems of the conventional technique and the purpose of the present invention is to enhance heat resistance of the tunnel magnetic resistance element and to obtain excellent magnetic resistance properties after magnetic heat treatment in higher temperatures.

Means for Solving the Problem

To achieve at least one of the abovementioned objects, according to an aspect of the present invention, a tunnel magnetic resistance element reflecting one aspect of the present invention includes, a fixed magnetic layer in which a direction of magnetization is fixed; a free magnetic layer which receives influence of a magnetic field from outside and in which the direction of magnetization changes; and an insulating layer which is positioned between the fixed magnetic layer and the free magnetic layer, wherein, the fixed magnetic layer, the free magnetic layer, and the insulating layer form a magnetic tunnel junction, a resistance of the insulating layer changes by a tunnel effect according to a difference in an angle between the direction of magnetization of the fixed magnetic layer and the direction of magnetization of the free magnetic layer, the free magnetic layer includes a ferromagnetic layer joined to the insulating layer, a soft magnetic layer including NiFe, and a magnetic bonding layer placed in between, and material of the magnetic bonding layer include Ru or Ta, and a layer thickness is 1.0 nm to 1.3 nm.

BRIEF DESCRIPTION OF THE DRAWINGS

The advantages and features provided by one or more embodiments of the invention will become more fully understood from the detailed description given hereinbelow and the appended drawings which are given by way of illustration only, and thus are not intended as a definition of the limits of the present invention.

EMBODIMENT FOR CARRYING OUT THE INVENTION

Hereinafter, one or more embodiments of the present invention will be described with reference to the drawings. However, the scope of the invention is not limited to the disclosed embodiments.

An embodiment of the present invention is described with reference to the drawings. The embodiment below is one example of the present invention, and does not limit the scope of the present invention.

Figure 1:
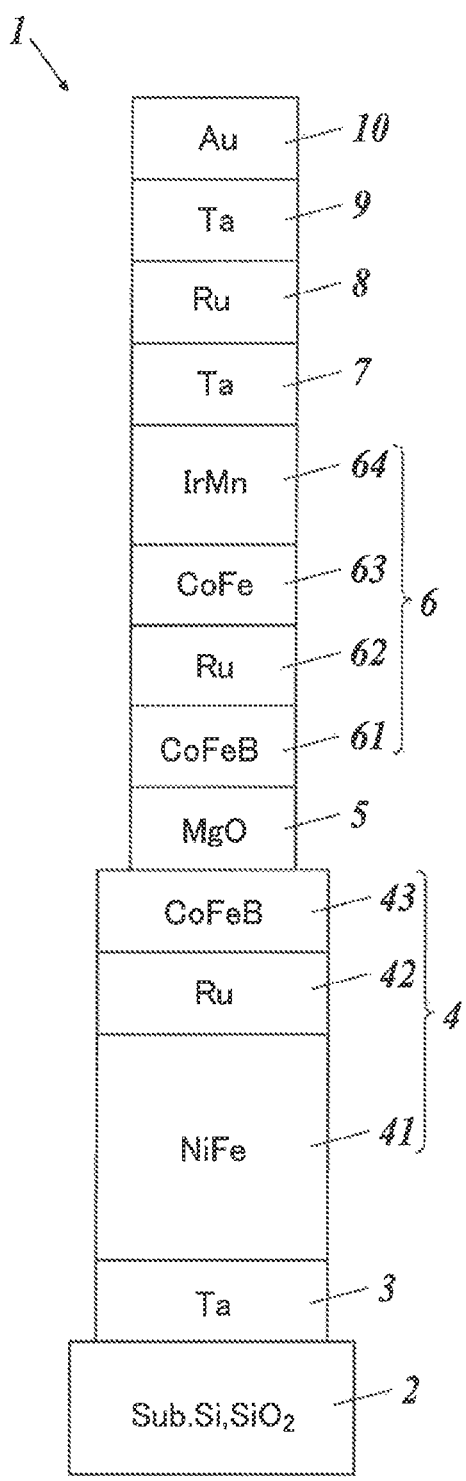
FIG. 1 is a cross sectional diagram showing a layered configuration of a TMR sensor module including a tunnel magnetic resistance element according to an embodiment of the present invention.

The tunnel magnetic resistance element 1 as shown in FIG. 1 includes a layered configuration layering on a substrate 2 in order, a base layer 3, a free magnetic layer 4, an insulating layer 5, a fixed magnetic layer 6, a corrosion resistance layer 7, a protecting layer 8, an electrode base layer 9, and an upper electrode layer 10.

The free magnetic layer 4 includes a layered structure layering from the bottom a soft magnetic layer 41, a magnetic bonding layer 42, and a ferromagnetic layer 43.

The fixed magnetic layer 6 includes a layered structure layering from the bottom a ferromagnetic layer 61, a magnetic bonding layer 62, a ferromagnetic layer 63, and an antiferromagnetic layer 64.

The material included are as follows, the substrate 2 includes silicon material (Si, SiO2), the base layer 3 includes Ta, the soft magnetic layer 41 includes NiFe, the magnetic bonding layer 42 includes Ru, the ferromagnetic layer 43 includes CoFeB, the insulating layer 5 includes MgO, the ferromagnetic layer 61 includes CoFeB, the magnetic bonding layer 62 includes Ru, the ferromagnetic layer 63 includes CoFe, the antiferromagnetic layer 64 includes IrMn, the corrosion resistance layer 7 includes Ta, the protecting layer 8 includes Ru, the electrode base layer 9 includes Ta, and the upper electrode layer 10 includes Au. Regardless of the embodiment, as for the material of the magnetic bonding layer 42 and the material of the magnetic bonding layer 62, either one may be Ta, or both may be Ta.

The base layer 3 functions as the base to crystalize the NiFe included in the soft magnetic layer 41. This enhances the flatness of the base of the soft magnetic layer 41 and the adhesiveness of NiFe.

The soft magnetic layer 41 receives the influence of the magnetic field from outside, changes the direction of magnetization, and reacts easier than the ferromagnetic layer 43. The thickness of the soft magnetic layer 41 is set to be balanced because if the thickness is thin, the TMR ratio becomes large, and if the thickness is thick, 2Hk becomes small. The NiFe included in the soft magnetic layer has a FCC crystal structure.

The magnetic bonding layer 42 magnetically bonds the soft magnetic layer 41 and the ferromagnetic layer 43. The magnetic bonding layer 42 functions to separate the crystal structure of the NiFe included in the soft magnetic layer 41 and the crystal structure of the CoFeB included in the ferromagnetic layer 43. If the magnetic bonding layer 42 is too thin, the crystal structure of the CoFeB is influenced by the crystal structure of the NiFe.

The crystal structure of the ferromagnetic layer 43 matches with that of the insulating layer 5 and the ferromagnetic layer 43 maintains spin jump. The CoFeB included in the ferromagnetic layer 43 is a BCC crystal structure. With the magnetic bonding layer 42 in between, the soft magnetic layer 41 and the ferromagnetic layer 43 are bonded by synthetic bonding.

The insulating layer 5 is an insulation resistance layer of the magnetic tunnel junction and crystallizes in a <001> direction. The resistance value and the TMR ratio for each unit area of a junction surface changes depending on the thickness of the insulating layer 5.

The crystal structure of the ferromagnetic layer 61 matches with that of the insulating layer 5 and the ferromagnetic layer 61 maintains spin jump. The CoFeB included in the ferromagnetic layer 61 is a BCC crystal structure. When the ferromagnetic layer 61 is formed, the structure is an amorphous structure. By performing a heat treatment, the B is released and the structure grows to a BCC crystal. The released B moves to a Ta layer or a MgO layer.

The magnetic bonding layer 62 magnetically bonds the ferromagnetic layer 61 and the ferromagnetic layer 63. The bonding of the CoFeB included in the ferromagnetic layer 61 and the CoFe included in the ferromagnetic layer 63 changes depending on the thickness of the magnetic bonding layer 62. The change is repeated every 0.4 nm. The thinner the thickness of the magnetic bonding layer 62 is, more bonding strength can be obtained. However, if the thickness is too thin, the heat treatment cannot be performed.

The ferromagnetic layer 63 is bonded with the ferromagnetic layer 61 by synthetic bonding. The CoFe included in the ferromagnetic layer 63 is the FCC crystal structure.

The IrMn included in the antiferromagnetic layer 64 influences the crystallizing of the CoFe included in the ferromagnetic layer 63 and enhances the fixing of the direction of magnetization of the ferromagnetic layer 63.

The corrosion resistance layer 7 prevents the oxidation of the lower layer.

The protecting layer 8 has a protecting effect and prevents deterioration over time. However, if the electrode of the upper layer is made right away, this may be omitted.

The electrode base layer 9 is a base to enhance adhesiveness of the upper electrode layer 10.

Lines are bonded to the upper electrode layer 10 by wire bonding.

(Manufacturing Method)

Figure 2A:
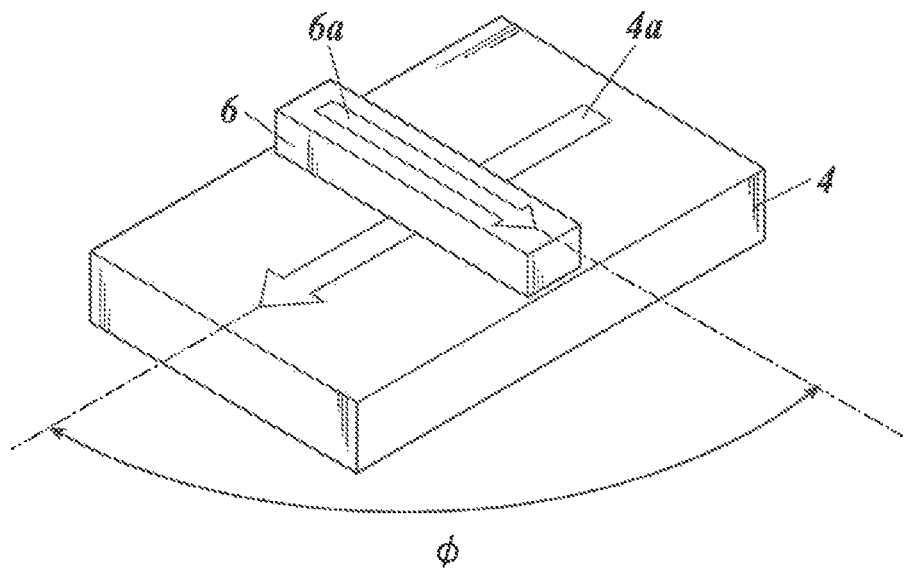
FIG. 2A is a schematic diagonal diagram of the tunnel magnetic resistance element according to an embodiment of the present invention illustrated with an insulating layer omitted.
Figure 2B:
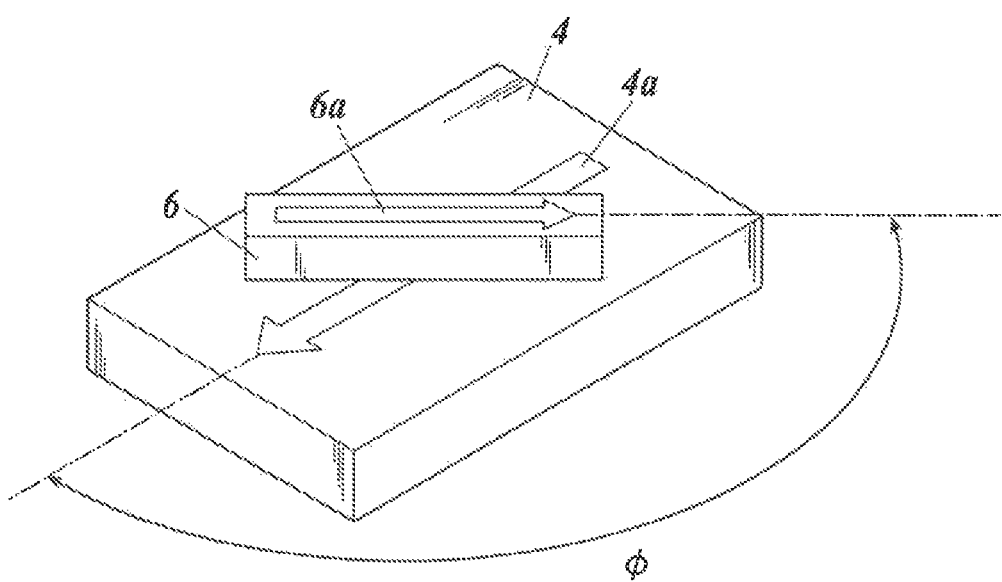
FIG. 2B is a schematic diagonal diagram of the tunnel magnetic resistance element according to an embodiment of the present invention illustrated with an insulating layer omitted.
Figure 3:
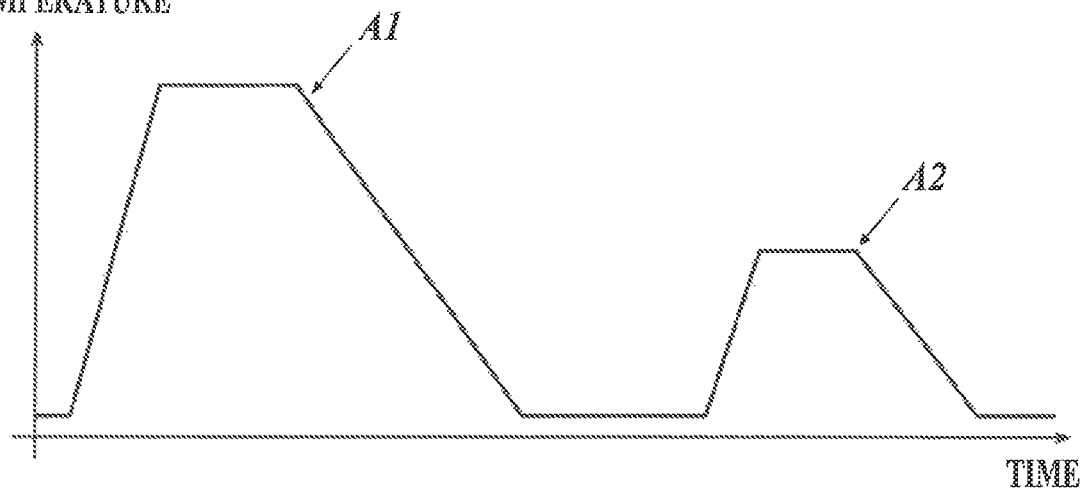
FIG. 3 is a graph showing transition of furnace temperature in a magnetic heat treatment process of the tunnel magnetic resistance element according to an embodiment of the present invention.

For example, each layer can be formed by a magnetron sputtering method. For the purpose of obtaining the desired crystal structure, the heat treatment can be performed as necessary. According to the present embodiment, as shown in FIG. 2A, FIG. 2B, an easy magnetization axis 4a of the free magnetic layer 4 is in a twisted position from an easy magnetization axis 6a of the fixed magnetic layer 6. In order to obtain the easy magnetization axes 4a, 6a having such relation, the substrate 2 with each layer layered is placed in the furnace and is also placed in a magnetic field, and as shown in FIG. 3, the heat treatment is performed twice with different temperature conditions.

First, the first heat treatment is performed to add magnetization induced anisotropy to the free magnetic layer 4 and the fixed magnetic layer 6. The easy magnetization axis 4a of the free magnetic layer 4 and the easy magnetization axis 6a of the fixed magnetic layer 6 are formed. The easy magnetization axis 4a and the easy magnetization axis 6a are in the same direction. A peak temperature (second temperature) in a temperature transition graph A2 of the second heat treatment is lower than a peak temperature (first temperature) in a temperature transition graph A1 of the first heat treatment (suitably, 10° C. or more lower). After the first heat treatment, preferably, after cooling to about room temperature, the second heat treatment is performed to form the easy magnetization axis 6a of the fixed magnetic layer 6 in the twisted position from the easy magnetization axis 4a. The easy magnetization axis 4a is formed along a magnetic field direction when the first heat treatment is performed. The easy magnetization axis 6a is formed along a magnetic field direction when the second heat treatment is performed. Therefore, by changing the magnetic field direction when the second heat treatment is performed from the magnetic field direction when the first heat treatment is performed, the easy magnetization axis 6a can be formed in the twisted position from the easy magnetization axis 4a. The magnetic field direction when the first heat treatment is performed is parallel by layer with the magnetic field direction when the second heat treatment is performed. Therefore, by rotating the magnetic field direction around an axis in the layering direction on the substrate 2 (=axis orthogonal to the substrate 2), the easy magnetization axis 6a can be formed in the twisted position from the easy magnetization axis 4a. There is no limit to the heat treatment time. For example, the heat treatment is to be performed about 10 minutes to 2 hours. Preferably, the time of the second heat treatment is shorter than the first heat treatment. There is no limit to the magnetic field when the heat treatment is performed. Preferably, for example, the process is performed within the range of 0.01 to 2 [T]. Preferably, the external magnetic field in the second heat treatment is smaller than that of the first heat treatment.

As shown in FIG. 2A, manufacturing is performed setting 90 degrees as the goal for a twisted angle ϕ between the easy magnetization axis 4a and the easy magnetization axis 6a. As shown in FIG. 2B, if the easy magnetization axis 4a and the easy magnetization axis 6a are not parallel, the sensitivity may be enhanced even if the twisted angle ϕ between the above is not 90 degrees. Preferably, the twisted angle is within the range of 45 degrees to 135 degrees.

As shown in FIG. 2A or FIG. 2B, an area of the fixed magnetic layer 6 is equal to the area of the free magnetic layer 4 or smaller than the area of the free magnetic layer 4. By making the area of the fixed magnetic layer 6 relatively small, the influence of the leakage magnetic field from the fixed magnetic layer 6 to the free magnetic layer 4 becomes small, and the sensitivity of magnetic detection is further enhanced. The ratio between the area of the fixed magnetic layer 6 and the area of the free magnetic layer 4 is not limited. Preferably, the ratio is set between the range of 1:1 to 1:10.

(Heat Resistance and Magnetic Resistance Properties)

In order to enhance the heat resistance of the tunnel magnetic resistance element 1 and to obtain excellent magnetic resistance properties after performing the magnetic heat treatment at a higher temperature, a layer thickness of the magnetic bonding layer 42 is set to 1.02 nm to 1.3 nm, and the peak temperature (first temperature) in the temperature transition graph A1 of the first heat treatment is set to 340° C. to 370° C.

Figure 4:
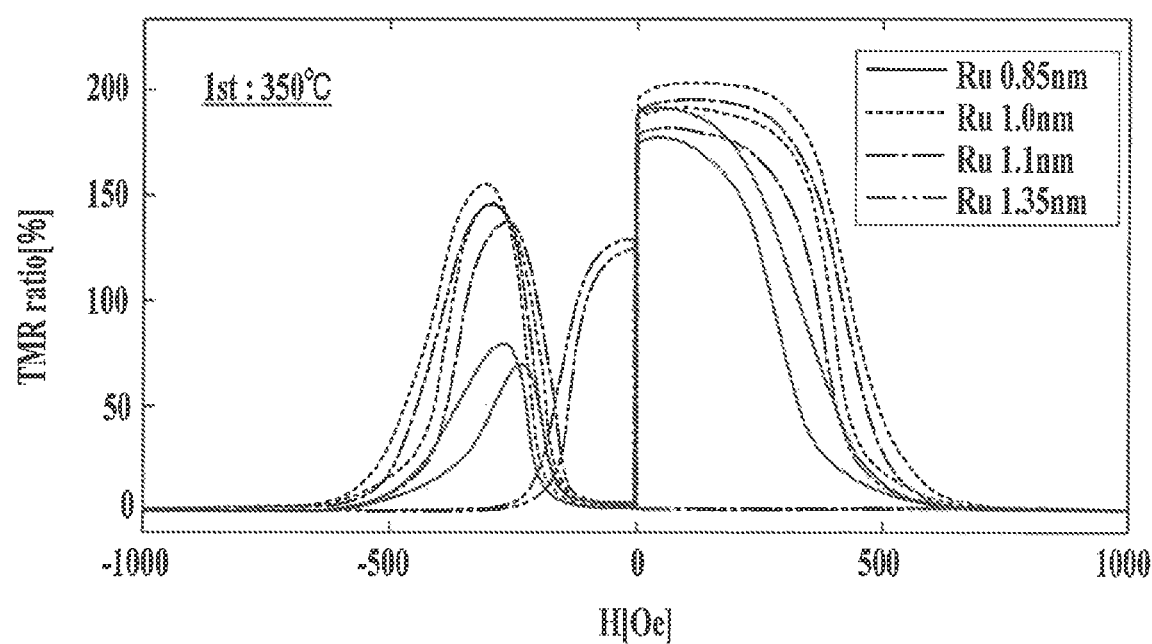
FIG. 4 is a graph showing a percentage of change in resistance of the tunnel magnetic resistance element (TMR ratio (%), vertical axis) with respect to an exterior magnetic field (H(Oe), horizontal axis) regarding an example of the present invention and a comparative example.

The graph in FIG. 4 shows the magnetic resistance properties of the tunnel magnetic resistance element 1 made according to the above embodiment, setting the first temperature to 350° C., and the layer thickness of the magnetic bonding layer 42 to 0.85, 1.0, 1.1, and 1.35 (nm).

Higher and more stable TMR ratio properties can be obtained when the layer thickness of the magnetic bonding layer 42 is 1.0 nm to 1.3 nm compared to when the range is above or below the above-described range.

INDUSTRIAL APPLICABILITY

The present invention can be used in a highly sensitive magnetic sensor and the like.

Although embodiments of the present invention have been described and illustrated in detail, the disclosed embodiments are made for purposes of illustration and example only and not limitation. The scope of the present invention should be interpreted by terms of the appended claims.

DESCRIPTION OF REFERENCE NUMERALS 1 tunnel magnetic resistance element
2 substrate
3 base layer
4 free magnetic layer
4a easy magnetization axis
5 insulating layer
6 fixed magnetic layer
6a easy magnetization axis
7 corrosion resistance layer
8 protecting layer
9 electrode base layer
10 upper electrode layer
41 soft magnetic layer
42 magnetic bonding layer
43 ferromagnetic layer
61 ferromagnetic layer
62 magnetic bonding layer
63 ferromagnetic layer
64 antiferromagnetic layer

The invention claimed is:

1. A tunnel magnetic resistance element comprising:
a fixed magnetic layer in which a direction of magnetization is fixed;
a free magnetic layer which receives influence of a magnetic field from outside and in which the direction of magnetization changes; and
an insulating layer which is positioned between the fixed magnetic layer and the free magnetic layer,
wherein,
the fixed magnetic layer, the free magnetic layer, and the insulating layer form a magnetic tunnel junction,
a resistance of the insulating layer changes by a tunnel effect according to a difference in an angle between the direction of magnetization of the fixed magnetic layer and the direction of magnetization of the free magnetic layer,
the free magnetic layer includes a ferromagnetic layer joined to the insulating layer, a soft magnetic layer including NiFe, and a magnetic bonding layer placed in between, and
material of the magnetic bonding layer includes Ru or Ta, and a layer thickness is 1.0 nm to 1.3 nm.

2. A method for manufacturing a tunnel magnetic resistance element according to claim 1 comprising:
performing a first heat treatment on the tunnel magnetic resistance element at a first temperature while applying an external magnetic field; and
performing a second heat treatment at a second temperature lower than the first temperature while applying an external magnetic field in a direction different from the first heat treatment to make a direction of an easy magnetization axis of a ferromagnetic metal magnetization free layer different from a direction of an easy magnetization axis of a ferromagnetic metal magnetization fixed layer,
wherein the first temperature is set to 340° to 370°.

3. The tunnel magnetic resistance element of claim 1, wherein the material of the magnetic bonding layer includes Ru.

4. The tunnel magnetic resistance element of claim 1, wherein the fixed magnetic layer includes a further magnetic bonding layer arranged between a first ferromagnetic layer and a second ferromagnetic layer.

5. The tunnel magnetic resistance element of claim 4, wherein the fixed magnetic layer further includes an antiferromagnetic layer disposed on one of the first ferromagnetic layer and the second ferromagnetic layer to influence crystallizing.

* * * * *